United States Patent
Myers et al.

(10) Patent No.: US 8,456,223 B2
(45) Date of Patent: Jun. 4, 2013

(54) INTEGRATED CIRCUIT WITH POWER GATING

(75) Inventors: James Edward Myers, Bottisham (GB); David Walter Flynn, Cambridge (GB)

(73) Assignee: ARM Limited, Cambridge (GB)

( * ) Notice: Subject to any disclaimer, the term of this patent is extended or adjusted under 35 U.S.C. 154(b) by 168 days.

(21) Appl. No.: 13/067,776

(22) Filed: Jun. 24, 2011

(65) Prior Publication Data

US 2012/0326772 A1 Dec. 27, 2012

(51) Int. Cl.
*H03K 3/01* (2006.01)

(52) U.S. Cl.
USPC .......................................................... 327/534

(58) Field of Classification Search
USPC .................. 327/534, 535, 537, 544, 564, 565, 327/567
See application file for complete search history.

(56) References Cited

U.S. PATENT DOCUMENTS

| | | | | |
|---|---|---|---|---|
| 6,373,321 | B1 * | 4/2002 | Yamauchi et al. | 327/534 |
| 7,486,107 | B1 * | 2/2009 | Bose et al. | 326/33 |
| 7,675,347 | B2 * | 3/2010 | Teramoto et al. | 327/534 |
| 7,786,793 | B2 * | 8/2010 | Ogata | 327/544 |
| 8,120,410 | B2 * | 2/2012 | Meijer et al. | 327/534 |
| 8,164,969 | B2 * | 4/2012 | Shau | 365/226 |
| 8,299,847 | B2 * | 10/2012 | Matano | 327/544 |

OTHER PUBLICATIONS

P. Khaled et al, "Better Leakage Reduction by Exploiting the Built-in MOSFET-*Vth* Characteristics" *IEEE EIT 2007 Proceedings*, 2007, pp. 85-90.

Shin, Youngsoo et al., "Supply Switching with Ground Collapse: Simultaneous Control of Subthreshold and Gate Leakage Current in Nanometer-Scale CMOS Circuits", IEEE Transations on Very Large Scale Integration (VLSI) Systems, vol. 15, No. 7, (Jul. 2007), pp. 758-766.

Kim, Suhwan et al., "Experimental Measurement of a Novel Power Gating Structure with Intermediate Power Saving Mode", Proceedings of the 2004 International Symposium on Low Power Electronics and Design (ISLPED), (2004), pp. 20-25.

* cited by examiner

*Primary Examiner* — Jeffrey Zweizig
(74) *Attorney, Agent, or Firm* — Nixon & Vanderhye P.C.

(57) ABSTRACT

An integrated circuit includes a main power rail, a ground power rail as well as a virtual main power rail and a virtual ground power rail. Combinatorial logic circuitry is connected to draw its power from the virtual main power rail and the virtual ground power rail. Signal value storage circuitry is connected to draw its power from one of the main power rail and the ground power rail with the other power connection being to a virtual rail. The integrated circuit has an operational mode, a retention mode and a power off mode. In the retention mode, the voltage difference across the combinatorial logic circuitry is a low power voltage difference insufficient to support data processing operations whereas the voltage difference across the signal value storage circuitry is higher and is sufficient to support signal value retention within the signal value storage circuitry.

16 Claims, 8 Drawing Sheets

INTEGRATED CIRCUIT WITH POWER GATING

BACKGROUND OF THE INVENTION

1. Field of the Invention

This invention relates to the field of integrated circuits. More particularly, this invention relates to integrated circuits which use power gating so as to reduce power consumption of the integrated circuit.

2. Description of the Prior Art

Power gating is a known and effective technique for mitigating leakage power over long idle periods in integrated circuit designs. Functional state may be restored through a reset or otherwise after power up. A disadvantage that limits the usefulness of such power gating is that powering up after the power gating can have a large energy cost. There are a number of reasons for this large energy cost including the large power grid capacitance that must be slowly recharged, gated logic suffering crowbar currents until the virtual rail voltages reach approximately the transistor threshold voltages, and that logic values will be re-evaluated on power up drawing more dynamic power than after a functional mode clock event as switching activity is normally reduced by design during functional mode clocking.

SUMMARY OF THE INVENTION

Viewed from one aspect the present invention provides an integrated circuit comprising:

a main power rail;

a virtual main power rail connected to said main power rail by one or more first operational mode transistors and one or more first retention mode transistors;

a ground power rail;

a virtual ground power rail connected to said ground power rail by one or more second operational mode transistors and one or more second retention mode transistors;

combinatorial logic circuitry connected between said virtual main power rail and said virtual ground power rail;

signal value storage circuitry connected between one of:

(a) said main power rail and said virtual ground power rail; and (b) said virtual main power rail and said ground power rail; and power control circuitry coupled to and configured to control said one or more first operational mode transistors, said one or more first retention mode transistors, said one or more second operational mode transistors and said one or more second retention mode transistors such that:

(i) in an operational mode said one or more first operational mode transistors and said one or more second operational mode transistors are in a low impedance state to provide an operating voltage difference sufficient to support data processing operations and signal value retention across said combinatorial logic circuitry and said signal value storage circuitry;

(ii) in a retention mode said one or more first operational mode transistors and said one or more second operational mode transistors are in a high impedance state and said one or more first retention mode transistors and said one or more second retention mode transistors are in a low impedance state to provide a low power voltage difference insufficient to support data processing operations across said combinatorial logic circuitry and a retention voltage difference greater than said low power voltage difference and sufficient to support signal value retention across said signal value storage circuitry; and (iii) in a power off mode said one or more first operational mode transistors, said one or more second operational mode transistors, said one or more first retention mode transistors and said one or more second retention mode transistors are in a high impedance state to provide a power off voltage difference insufficient to support data processing operations and signal value retention across said combinatorial logic circuitry and said signal value storage circuitry.

The present technique serves to keep the voltage difference across the combinatorial logic circuitry higher than if full power gating is used such that there are reduced or no crowbar currents and reduced or no re-evaluation when the operational mode is re-entered. Furthermore, the amount of current required to recharge the power grid is also reduced. The leakage during the retention mode will be higher than during the power off mode, but the advantage of reduced energy cost on power up after retention mode is such that retention mode is worthwhile even if only used for short periods of time. This contrasts with the power off mode in which if the power off mode is only used for a short period of time, then the energy cost on power up may exceed the energy saved due to reduced leakage during a short duration in which the integrated circuit is in the power off mode. The configuration of the one or more first retention mode transistors and the one or more second retention mode transistors are such that when these are in their low impedance state they provide a low power voltage difference insufficient to support data processing operations across the combinatorial logic and a retention voltage difference greater than the low power voltage difference and sufficient to support signal value retention across the signal value storage circuitry. The combinatorial logic draws its power from the virtual rails. The signal value storage circuitry draws its power between one of the main power rail and the ground power rail and the corresponding other virtual rail. In this way, the retention voltage difference across the signal value storage circuitry is higher than the voltage difference across the combinatorial logic circuitry. The signal value storage circuitry is thus able to retain signal values while the combinatorial logic circuitry is placed into a lower leakage state, but one which nevertheless reduces crowbar currents on power up and reduces the amount of energy needed to recharge the virtual rails.

A reliable way of achieving the required voltage drop across the one or more first retention mode transistors and the one or more second retention mode transistors during the retention mode is to arrange these to serve as controllable diodes, i.e. using N-type field effect transistors as the one or more first operational mode transistors connected to the virtual main power rail and using P-type field effect transistors as the one or more second retention mode transistors connected to the virtual ground power rail.

A good balance between reducing leakage in the combinatorial logic circuitry during the retention mode whilst permitting signal value retention within the signal value storage circuitry may be achieved in embodiments in which a voltage difference between said main power rail and said ground power rail is Vop Volts when Vop/3 is greater than or equal to (Vop−(Vtn+Vtp)).

The integration of the retention mode with the operational mode and the power off mode may be facilitated in embodiments in which a reset mode is provided during which the power control circuitry places into a high impedance state the one or more retention mode transistors which are supplying power to the signal value storage circuitry (which is placed in to a low power state) such that signal values are not retained within the signal value storage circuitry during the reset mode. Thus, the reset mode can place the integrated circuit into a substantially known state from which it may be powered up in a manner which can reduce energy cost by exploiting the known state in which the integrated circuit emerges from the reset mode to reduce switching and other energy consuming effects.

In order to support the higher power requirements during the operational mode, the operational mode transistors may be configured to have a greater drive strength than the retention mode transistors.

In order that any signals passed from the combinatorial logic circuitry to the signal value storage circuitry during the retention mode do not compromise signal value storage within the signal value storage circuitry, some embodiments may include an isolation gate located in such a signal path and switched to output a predetermined signal value when in the retention mode.

As discussed above, one way of controlling the voltage drop across the retention mode transistors is to configure these to serve as controllable diodes.

Another technique which may be used in combination with the above and which may also be applied to the operational mode transistors is to pulse width modulate the gate voltages applied to these transistors so as to control their average drive strength and voltage drop.

One example of such a use is if the voltage difference between the main power rail and the ground power rail is reduced due to voltage scaling, then the gate voltages of the retention mode transistors may be pulse width modulated so as to provide a reduced voltage drop thereby permitting appropriate voltage differences to be maintained across the combinatorial logic circuitry and the signal value storage circuitry during the retention mode.

As previously mentioned, the retention mode can be considered to provide an intermediate state between the operational mode and the power off mode. The power off mode will provide greater power savings if it is maintained for a sufficient period. It is difficult to predict how long an integrated circuit may remain idle. One simple and effective way of controlling the entry into the power off mode is that the power control circuitry should first switch the integrated circuit into the retention mode and then switch from the retention mode to the power off mode after a predetermined number of clock cycles have elapsed without any trigger to return to the operational mode.

Viewed from another aspect the present invention provides an integrated circuit comprising:
  main power rail means for providing a main power voltage;
  virtual main power rail means for providing a virtual main power voltage and connected to said main power rail means by one or more first operational mode transistor means for selectively conducting and one or more first retention mode transistor means for selectively conducting;
  ground power rail means for providing a ground power voltage;
  virtual ground power rail means for providing a virtual ground power voltage and connected to said ground power rail means by one or more second operational mode transistor means for selectively conducting and one or more second retention mode transistor means for selectively conducting;
  combinatorial logic means for performing processing operations and connected between said virtual main power rail means and said virtual ground power rail means;
  signal value storage means for storing a signal value and connected between one of:
    (a) said main power rail means and said virtual ground power rail means; and
    (b) said virtual main power rail means and said ground power rail means; and
  power control means for controlling power and coupled to and configured to control said one or more first operational mode transistor means, said one or more first retention mode transistor means, said one or more second operational mode transistor means and said one or more second retention mode transistor means such that:
    (i) in an operational mode said one or more first operational mode transistor means and said one or more second operational mode transistor means are in a low impedance state to provide an operating voltage difference sufficient to support data processing operations and signal value retention across said combinatorial logic means and said signal value storage means;
    (ii) in a retention mode said one or more first operational mode transistor means and said one or more second operational mode transistor means are in a high impedance state and said one or more first retention mode transistor means and said one or more second retention mode transistor means are in a low impedance state to provide a low power voltage difference insufficient to support data processing operations across said combinatorial logic means and a retention voltage difference greater than said low power voltage difference and sufficient to support signal value retention across said signal value storage means; and
    (iii) in a power off mode said one or more first operational mode transistor means, said one or more second operational mode transistor means, said one or more first retention mode transistor means and said one or more second retention mode transistor means are in a high impedance state to provide a power off voltage difference insufficient to support data processing operations and signal value retention across said combinatorial logic means and said signal value storage means.

Viewed from a further aspect the present invention provides a method of operating an integrated circuit having:
  a main power rail;
  a virtual main power rail connected to said main power rail by one or more first operational mode transistors and one or more first retention mode transistors;
  a ground power rail;
  a virtual ground power rail connected to said ground power rail by one or more second operational mode transistors and one or more second retention mode transistors;
  combinatorial logic circuitry connected between said virtual main power rail and said virtual ground power rail;
  signal value storage circuitry connected between one of:
    (a) said main power rail and said virtual ground power rail; and
    (b) said virtual main power rail and said ground power rail;
  and said method comprising the steps of:
    (i) in an operational mode, controlling said one or more first operational mode transistors and said one or more second operational mode transistors to have a low impedance state to provide an operating voltage difference sufficient to support data processing operations and signal value retention across said combinatorial logic circuitry and said signal value storage circuitry;
    (ii) in a retention mode, controlling said one or more first operational mode transistors and said one or more second operational mode transistors are in a high impedance state and said one or more first retention mode transistors and said one or more second retention mode transistors to have a low impedance state to provide a low power voltage difference insufficient to support data processing operations across said combinatorial logic circuitry and a retention voltage difference greater than said low power voltage difference and sufficient to support signal value retention across said signal value storage circuitry; and (iii) in a power off mode, controlling said one or more first operational mode transistors, said one or more second operational mode transistors, said one or more first retention mode transistors and said one or more second retention mode transistors to have a high impedance state to provide a power off voltage difference insufficient to support data processing operations and signal value retention across said combinatorial logic circuitry and said signal value storage circuitry.

It will be appreciated that an integrated circuit of the form discussed above may be formed using a standard cell library to control a computer to form layout data for controlling manufacture of that integrated circuit. The standard cell library will include standard cells of the type needed to produce the various power rail connections, operational mode transistors, retention mode transistors, combinatorial logic circuitry connected to the virtual rails, and signal value storage circuitry connected to one virtual rail and one of the main power rail or ground power rail. An aspect of the present invention is a computer readable storage medium storing in non-transitory form such a standard cell library adapted to provide an integrated circuit as described above.

The above, and other objects, features and advantages of this invention will be apparent from the following detailed description of illustrative embodiments which is to be read in connection with the accompanying drawings.

DESCRIPTION OF THE EMBODIMENTS

Figure 1:
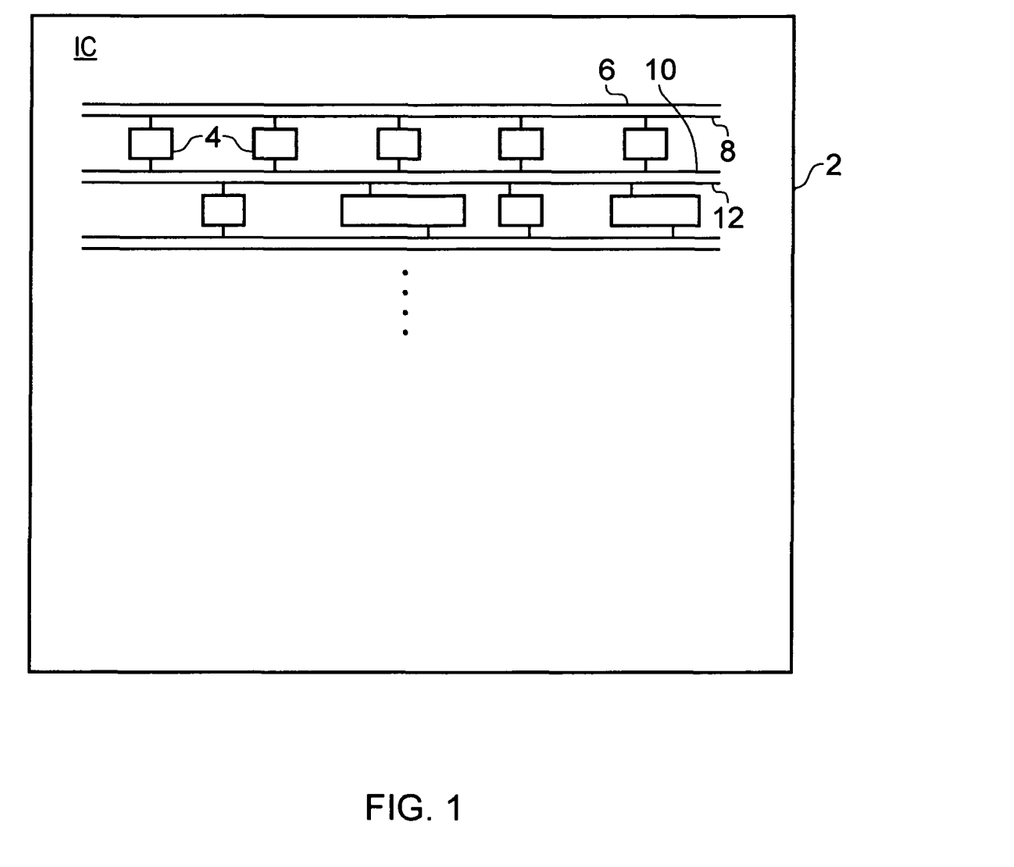
FIG. 1 schematically illustrates an integrated circuit formed using an array of standard cells connected between power rails and virtual power rails.

FIG. 1 schematically illustrates an integrated circuit 2 which is formed of a plurality of standard cells 4 connected between power rails. The power rails include a main power rail 6, a virtual main power rail 8, a virtual ground power rail 10 and a ground power rail 12. These power rails are repeated through the integrated circuit 2 in a regular sequence and the standard cells 4 disposed between the power rails and connected to the appropriate power rails as required.

Figure 2:
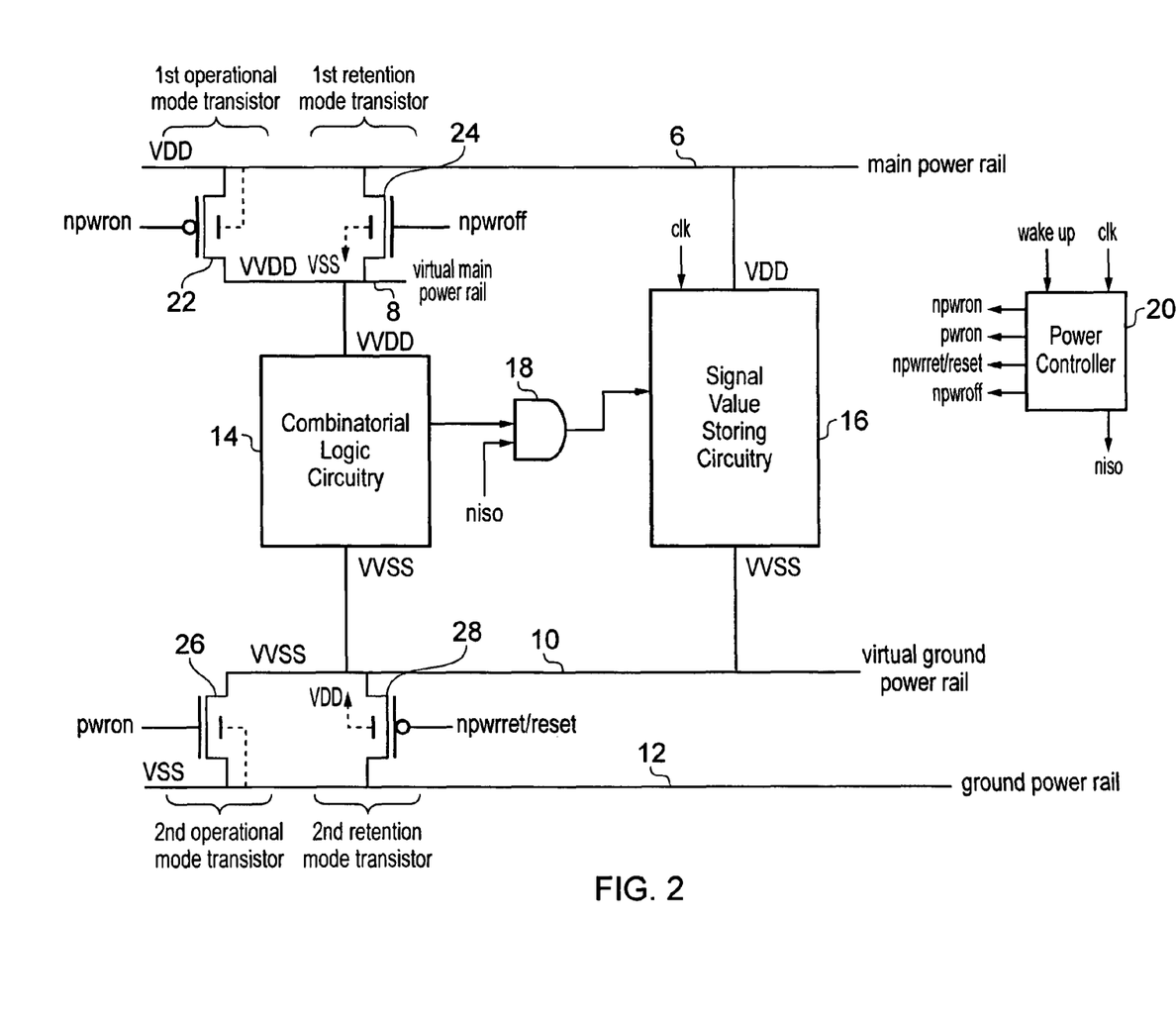
FIG. 2 schematically illustrates combinatorial logic circuitry and signal value storing circuitry connected to power rails.

FIG. 2 schematically illustrates a portion of an integrated circuit including combinatorial logic circuitry 14 and signal value storing circuitry 16. The combinatorial logic circuitry 14 receives a plurality of signal inputs and is controlled by a clock signal clk to perform combinatorial logic processing operations upon those signals to generate one or more output signals. The combinatorial logic circuitry 14 draws its power from the virtual main power rail 8 and the virtual ground power rail 10.

The signal value storage circuitry 16 serves to store one or more signal values under control of the clock signal clk. An isolation gate 18 in the form of an AND gate is disposed in the signal path between a signal output from the combinatorial logic circuitry 14 and an input to the signal value storage circuitry 16. This isolation gate 18 is controlled by an isolation signal niso generated by a power controller 20 when the system is in a retention mode of operation to block the signal path and to output a predetermined signal value and so reduce the likelihood of any signal values stored within the signal value storage circuitry 16 being perturbed by a signal received from the combinatorial logic circuitry 14 when this is in its retention mode state and there is a likelihood that signal value is output therefrom may inappropriately change.

The virtual main power rail 8 is connected via a first operational mode transistor 22 and a first retention mode transistor 24 to the main power rail 6. The first operational mode transistor 22 is a P-type field effect transistor. The first retention mode transistor 24 is an N-type field effect transistor. The drive strength of the first operational mode transistor 22 is greater than the drive strength of the first retention mode transistor 24 (this may be achieved by varying the transistor dimensions). The use of an N-type field effect transistor to serve as the first retention mode transistor 24 has the effect that when the first retention mode transistor 24 is in its low impedance state there is a voltage drop approximately equivalent to the threshold voltage Vtn of the first retention mode transistor 24 established between the main power rail 6 and the virtual power rail 8. In this state of operation (retention mode), the first operational mode transistor 22 is switched into its high impedance state. The switching of the various power control transistors illustrated in FIG. 2 is controlled by the power controller 20 which generates power control signals supplied to the gates of the various transistors as illustrated in FIG. 2. The transistors are switched between a high impedance state and a low impedance state depending upon the required mode of operation.

The virtual ground power rail 10 is connected to the ground power rail 12 via a second operational mode transistor 26 and a second retention mode transistor 28. The second operational mode transistor 26 is an N-type field effect transistor. The second retention mode transistor 28 is a P-type field effect transistor. The use of a P-type field effect transistor as the second retention mode transistor 28 serves to provide a diode type voltage drop of Vpt across the second retention mode transistor 28 when operating in the retention mode with the second retention mode transistor 28 in its low impedance state and the second operational mode transistor 26 in its high impedance state. The drive strength of the second operational mode transistor 26 is greater than that of the second retention mode transistor 28.

If the voltage difference between the ground power rail 12 and the main power rail 6 is Vop, then the threshold voltages Ven, Vep of the first retention mode transistor 24 and the second retention mode transistor 28 may be chosen such that Vop/3 is greater than or equal to (Vop−(Vtn+Vtp)). Thus, during the retention mode the voltage between the virtual main power rail 8 and the virtual ground power rail 10 may be maintained at a level that is less than or equal to a third of the operational voltage Vop used during operational mode.

As the signal value storage circuitry is connected in this example embodiment between the main power rail 6 and the virtual power rail 10 then the voltage difference across the signal value storage circuitry 16 during the retention mode will be Vop–Vtp. This is a retention voltage difference and is greater than the voltage difference across the combinatorial logic circuitry 14 during the retention mode which is lower and may be considered to be a low power voltage difference. The leakage current through the combinatorial logic circuitry 14 during the retention mode will be lower due the smaller magnitude of the low power voltage difference, but should be sufficient to avoid large crowbar currents when the combinatorial logic is powered up as many signal levels will be maintained and to avoid an excessive energy consumption in recharging the virtual main power rail 8 and the virtual ground power rail 10. The retention voltage difference across the signal value storage circuitry 16 during the retention mode is sufficient to ensure that signal values within the signal value storage circuitry 16 are properly retained such that upon exiting the retention mode no data has been lost and processing may resume.

The low power voltage difference across the combinatorial logic circuitry 14 may be sufficient for many signal values within the combinatorial logic circuitry 14 to be retained, but if some of these signal values do change then they will be re-evaluated when the combinatorial logic circuitry 14 is powered up and the operational mode is resumed. The isolation gate 18 serves to ensure that the signal value storage circuitry 16 is protected from any changes in signal outputs from the combinatorial logic circuitry 14 that do occur during the retention mode.

It will be appreciated that in FIG. 2 only single examples of the first operational mode transistor 22, the first retention mode transistor 24, the second operational mode transistor 26 and the second retention mode transistor 28 have been illustrated. In practice, multiple such transistors may be provided disposed along the length of the power rails 6, 8, 10, 12 and distributed throughout the integrated circuit 2.

It will further be appreciated that in this example embodiment the signal value storage circuitry is illustrated as drawing its power supply from the main power rail 6 and the virtual ground power rail 10. In other embodiments it is equally possible that the signal value storage circuitry 16 could draw its power from the virtual main power rail 8 and the ground power rail 12.

Figure 3:
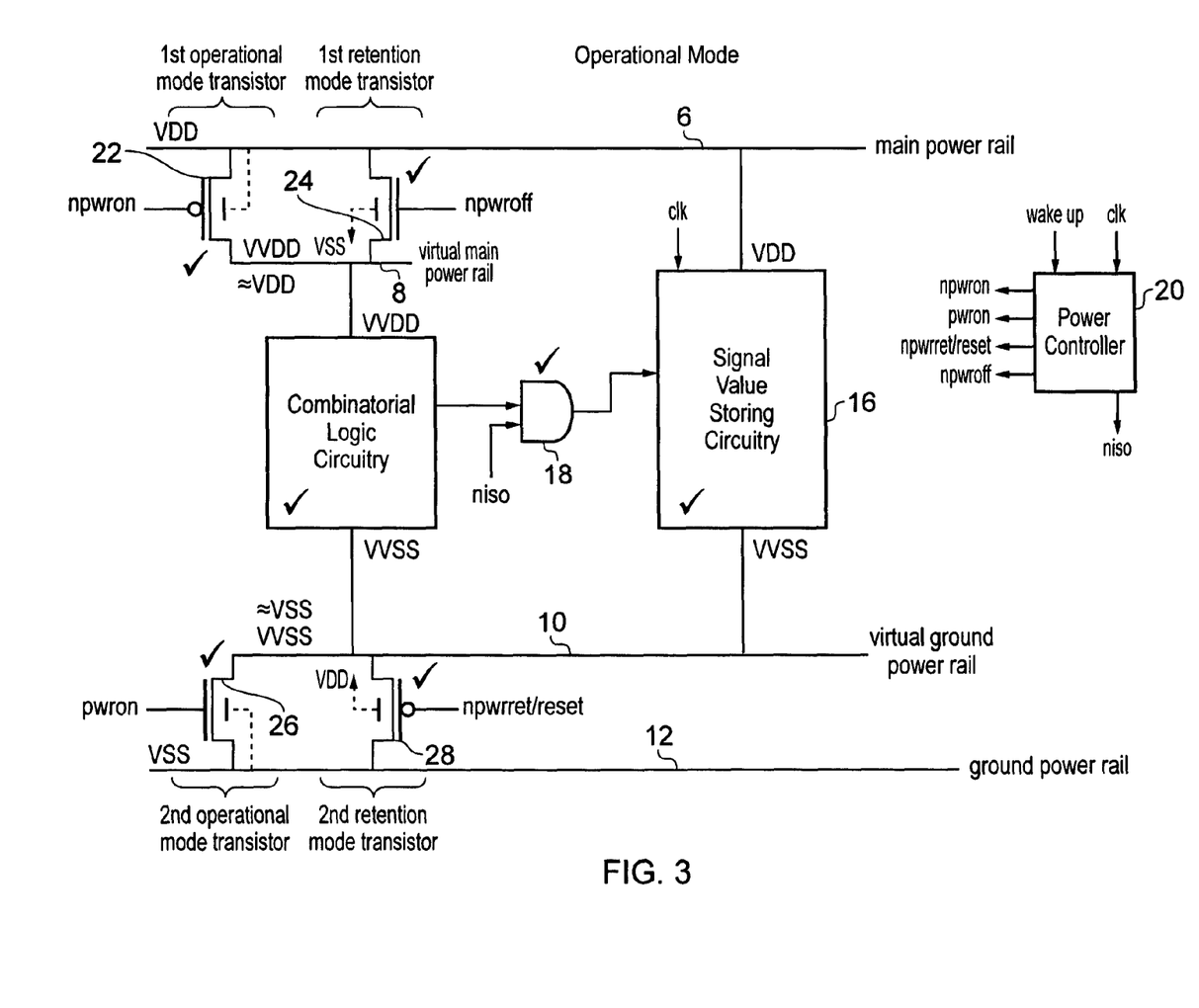
FIG. 3 schematically illustrates the circuitry of FIG. 2 in an operational mode.

FIG. 3 schematically illustrates the state of the circuit of FIG. 2 during the operational mode. During the operational mode all of the first operational mode transistor 22, the first retention mode transistor 24, the second operational mode transistor 26 and the second retention mode transistor 28 are switched into their low impedance state by the power controller 20. The combinatorial logic circuitry 14 is active and performs processing operations with its inputs driven from synchronous sources. The isolation gate 18 is open and the signal path between the combinatorial logic circuitry 14 and the signal value storage circuitry 16 is open. The signal value storage circuitry 16 serves to store signal values under control of the clock signals clk. During the operational mode, the voltage at the virtual main power rail 8 is approximately equal to the voltage at the main power rail 6 and similarly the voltage at the virtual ground power rail 10 is approximately equal to that at the ground power rail 12. In other embodiments, the first retention mode transistor 24 and the second retention mode transistor 28 may be switched off during the operational mode as they are not required to drive the virtual main power rail 8 and the virtual ground power rail 10.

Figure 4:
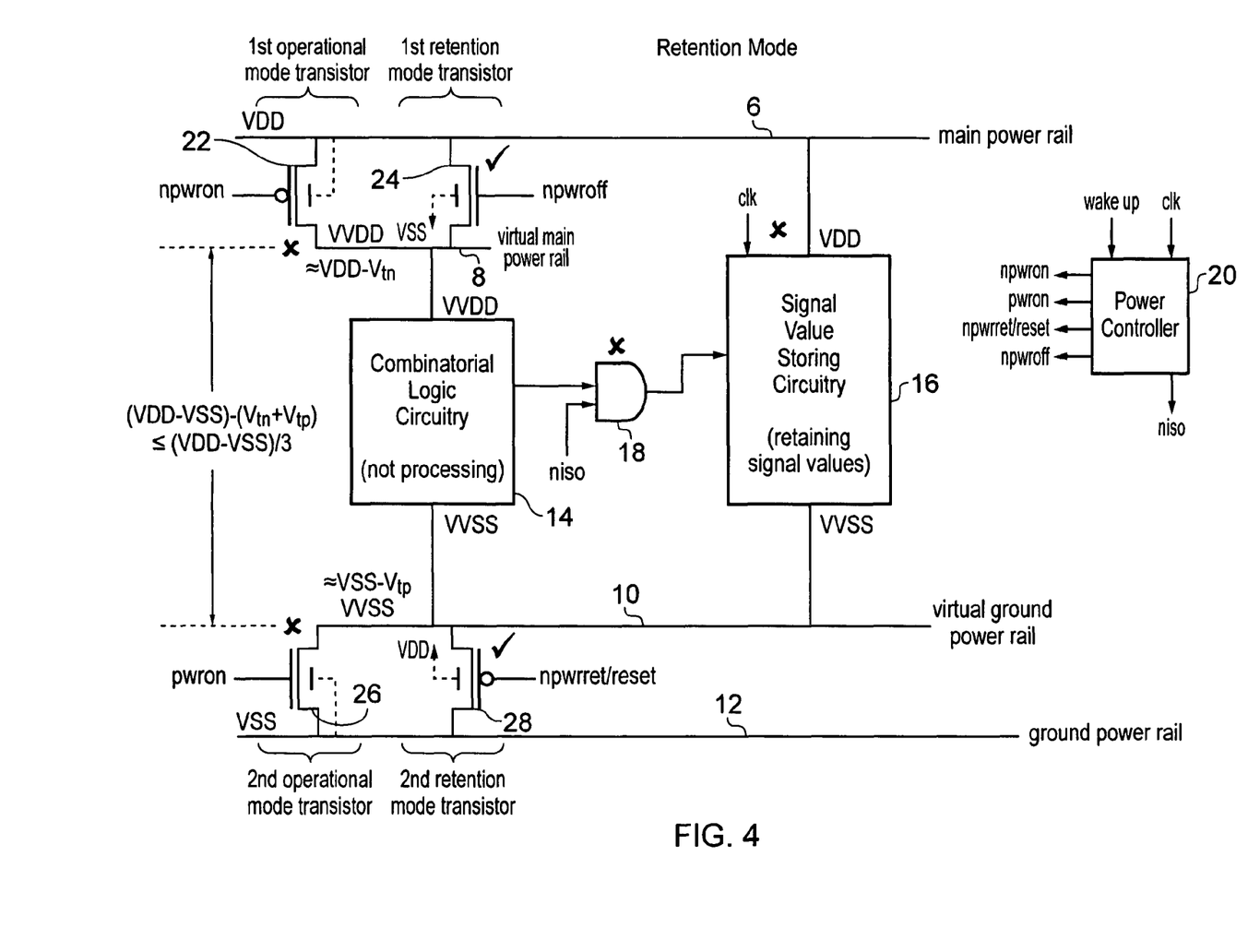
FIG. 4 schematically illustrates the circuitry of FIG. 2 in a retention mode.

FIG. 4 schematically illustrates the operation of the circuit of FIG. 2 during retention mode. In the retention mode the first operational mode transistor 22 and the second operational mode transistor 26 are both switched to their high impedance state. The first retention mode transistor 24 and the second retention mode transistor 28 are both switched to their low impedance state. The switching of these transistors is controlled by the power controller 20. The effect of the first retention mode transistor 24 is to produce a voltage on the virtual main power rail 8 which is approximately Vtn (threshold voltage of the first retention mode transistor 24) lower than the main power rail voltage VDD. Thus, the first retention mode transistor 24 serves as a controllable diode producing a diode voltage drop Vtn across the first retention mode transistor 24. In a similar way, the second retention mode transistor 28 provides a voltage drop of Vtp (threshold voltage of the second retention mode transistor 28) between the ground power rail voltage VSS and the virtual ground power rail voltage VSS–Vtp. As previously discussed, the voltage difference VDD–VSS is equal to or greater than three times the difference between the virtual main power rail voltage and the virtual ground power rail voltage during the retention mode.

During the retention mode, the combinatorial logic circuitry 14 and the signal value storage circuitry 16 are not clocked. The isolation gate 18 is in its high impedance state and blocks the signal path between the combinatorial logic circuitry 14 and the signal value storage circuitry 16. The signal value storage circuitry 16 retains signal values during the retention mode.

The power controller 20 produces the gate signals supplied to the first operational mode transistor 22, the first retention mode transistor 24, the second operational mode transistor 26 and the second retention mode transistor 28. It is possible that these gate signals may be pulsed width modulated in order to provide a level of impedance through the respective transistors which is intermediate between their high impedance state and their low impedance state. This may be useful, for example, if the voltage difference between the main power rail 6 and the ground power rail 12 is increased (e.g. due to voltage scaling) and it is desired to produce more voltage drop across the first retention mode transistor 24 and the second retention mode transistor 28 during the retention mode. Another possibility is pulse width modulating the gate voltages of at least one of the first operational mode transistor 22 and the second operational mode transistor 26 to provide a reduced voltage difference between the main power rail 6 and the ground power rail 12 as part of voltage scaling.

Figure 5:
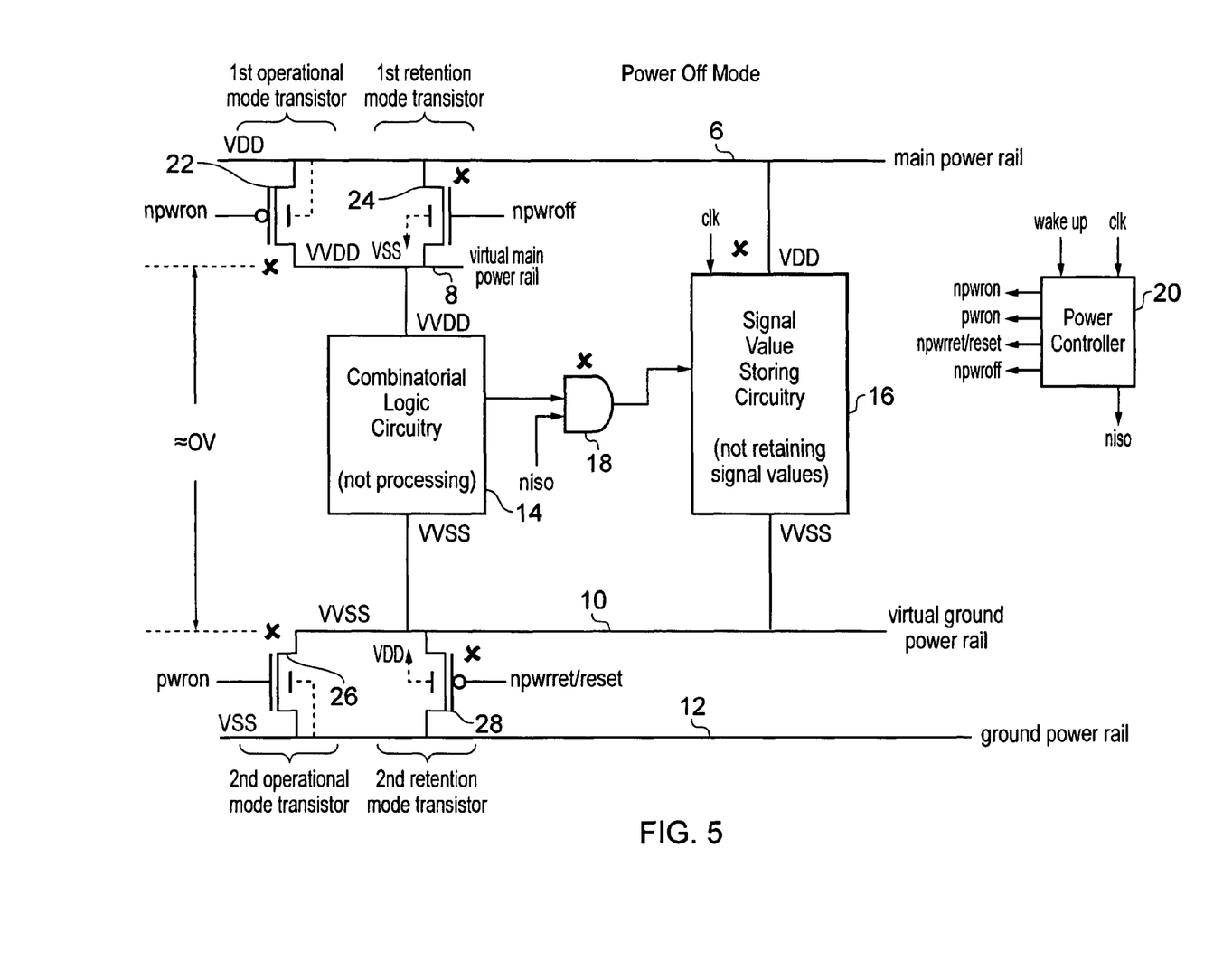
FIG. 5 schematically illustrates the circuitry of FIG. 2 in a power off mode.

FIG. 5 schematically illustrates the circuitry of FIG. 2 during the power off mode. In the power off mode all of the first operational mode transistor 22, the first retention mode transistor 24, the second operational mode transistor 26 and the second retention mode transistor 28 are switched to their high impedance state by the power controller 20. The voltage difference between the virtual main power rail 8 and the virtual ground power rail 10 thus collapses to substantially zero as does the voltage difference between the main power rail 6 and the virtual ground power rail 10. Thus, leakage current through the combinatorial logic circuitry 14 and the signal value storage circuitry 16 is reduced during power off mode compared to during the retention mode. However, during the power off mode the signal value storage circuitry 16 is not able to retain signal values.

In a reset mode of operation the second retention mode transistor 28 may be switched to its high impedance state thereby isolating the signal value storage circuitry 16 from the ground power rail 12 and resetting the signal value storage circuitry 16 such that it no longer retains any previously held signal values. This places the circuitry into a known state from which it may be powered up at reduced energy cost.

Figure 6:
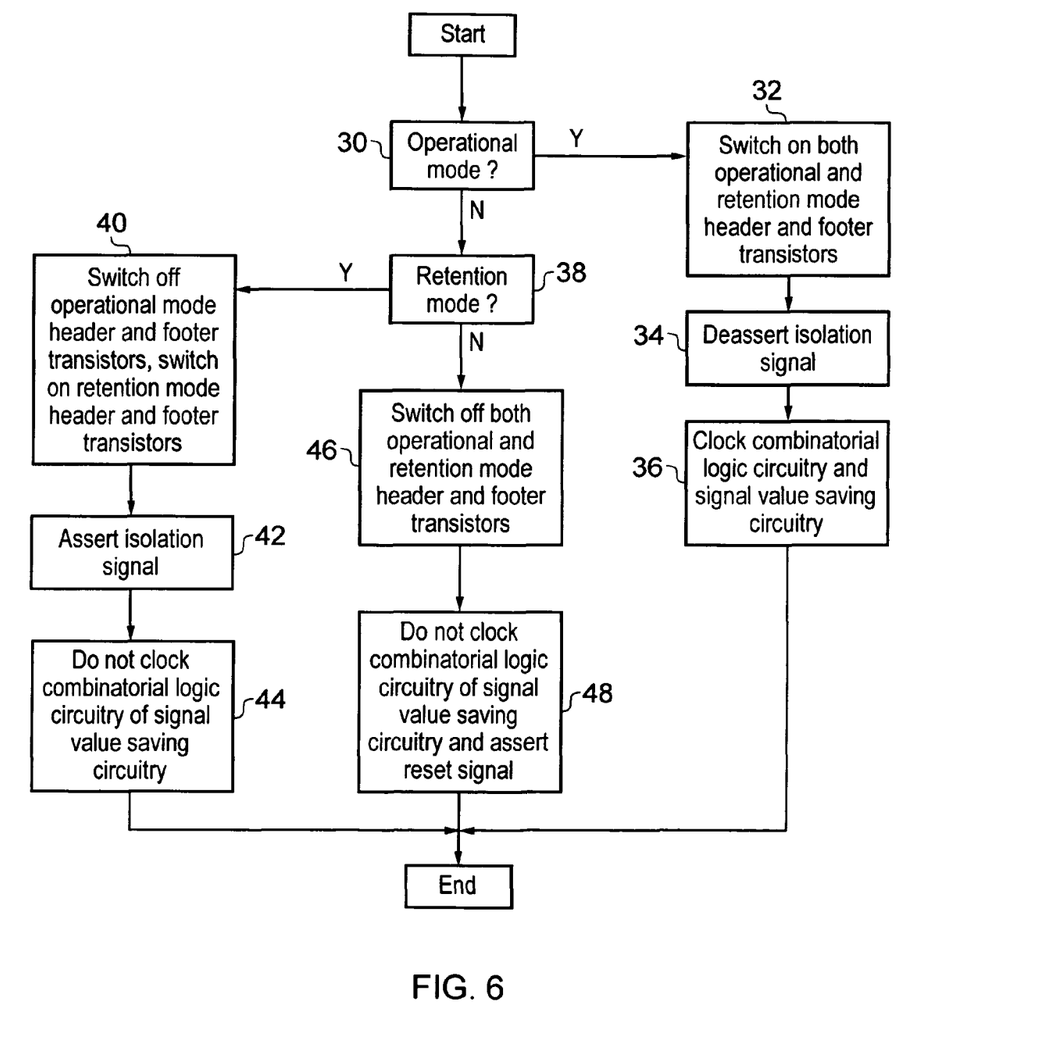
FIG. 6 is a flow diagram schematically illustrating power mode control.

FIG. 6 is a flow diagram schematically illustrating the operation of the power controller 20. At step 30 a determination is made as to whether or not the system is in the operational mode. If the system is in the operational mode, then step 32 switches on (or keeps switched on) both the operational and retention mode header and footer transistors 22, 24, 26, 28. It will be appreciated that the first operational mode transistor 28, the first retention mode transistor 24, the second operational mode transistor 26 and the second retention mode transistor 28 serve as header and footer transistors in the terminology sometimes used with power gating. At step 34 the isolation signal controlling the isolation gate 18 is deasserted so the signal path is opened. At step 36, both the combinatorial logic circuitry 14 and the signal value storage circuitry 16 is clocked to provide normal operation.

If the determination at step 30 is that the system is not in operational mode, then step 38 determines whether or not the system is the retention mode. If the system is in the retention mode, then step 40 switches off the operational mode header and footer transistors 22, 26 and switches on the retention mode header and footer transistors 24, 28. Step 42 asserts the isolation signal to the isolation gate 18 such that the signal path between the combinatorial logic circuitry 14 and the signal value storage circuitry 16 is blocked. At step 44 the clock signals to the combinatorial logic circuitry 14 and the signal value storage circuitry 16 are blocked such that these are not clocked. The combinatorial logic circuitry accordingly does not perform any processing operations, but the signal value storage circuitry 16 will continue to retain any previously held signal values.

If the determination at step 38 is that the system is not the retention mode, then the system is in the power off mode and processing proceeds to step 46 where all of the operational and retention mode header and footer transistors 22, 24, 26, 28 are switched off. Step 48 then serves to block the clocking of the combinatorial logic circuitry and of the signal value saving circuitry as well as asserting the reset signal as appropriate to ensure that the circuitry will emerge from the power off state in a known condition in which any previously stored signal values have been overwritten.

Figure 7:
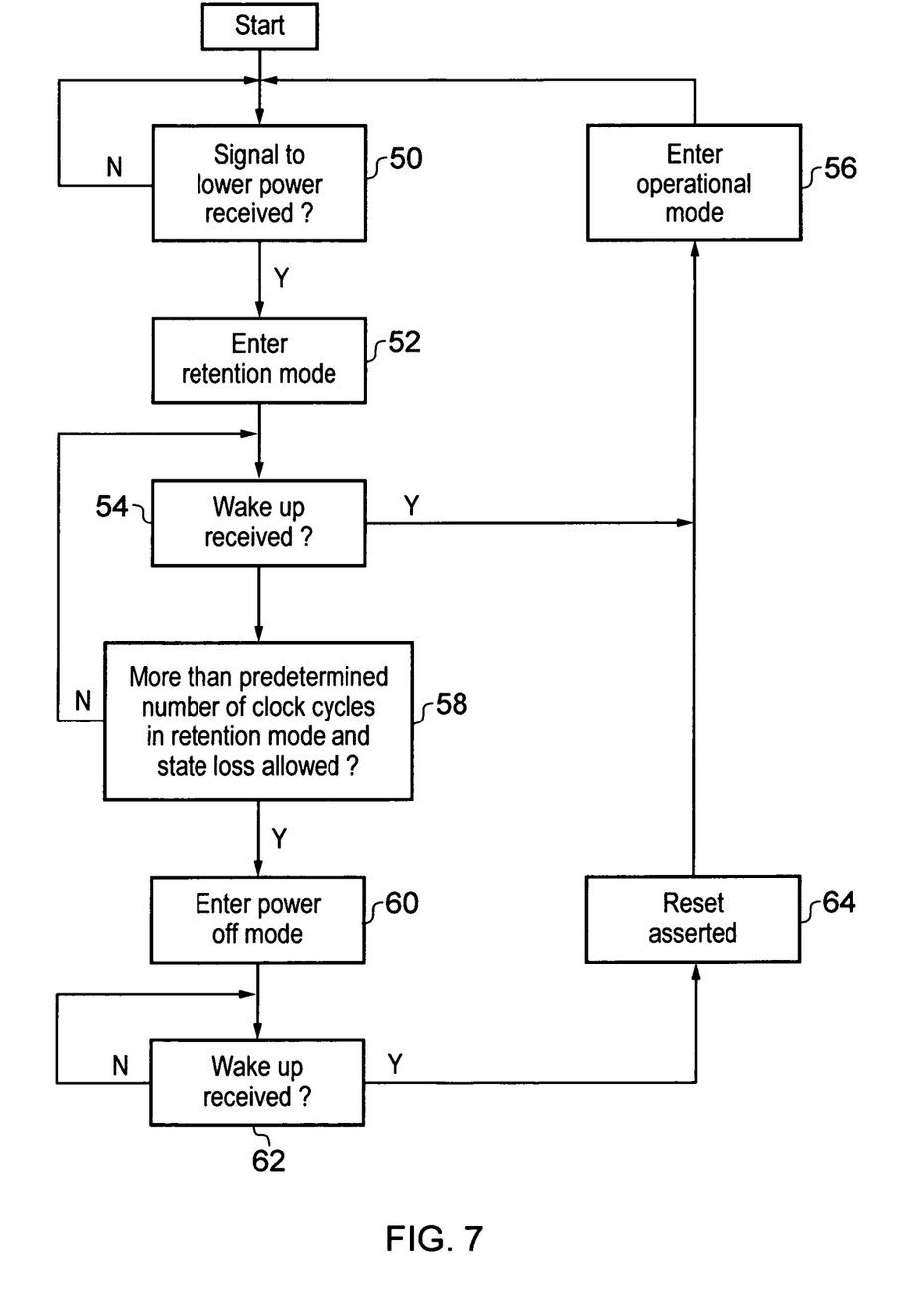
FIG. 7 is a flow diagram schematically illustrating control of movement between power modes.

FIG. 7 is a flow diagram schematically illustrating the moving between different power modes. At step 50 processing waits until a signal is received indicating that a shift to low power mode should be made. Such a signal may arise, for example, if the integrated circuit 2 has been idle for more than a predetermined amount of time. When such a signal to enter a low power mode is received, then step 52 places the system into the retention mode in accordance with FIG. 6. At step 54, a determination is made as to whether or not a wakeup signal has been received. If a wakeup signal has been received, then processing proceeds to step 56 where a return is made to the operational mode. If no wakeup signal has been received at step 54, then processing proceeds to step 58 where a determination is made as to whether or not the system has been in the retention mode for more than a predetermined number of clock cycles and that state loss is allowed in the current operating conditions. If the system has not been in the retention mode for more than a predetermined number of clock cycles, then processing returns to step 54. If the system has been in the retention mode for greater than the predetermined number of clock cycles, then processing proceeds to step 60 where the power off mode is entered. When in the power off mode, processing cycles around step 62 waiting for a wakeup signal to be received whereupon processing returns via a reset asserting step 64 to step 56 and the operational mode is re-entered.

Figure 8:
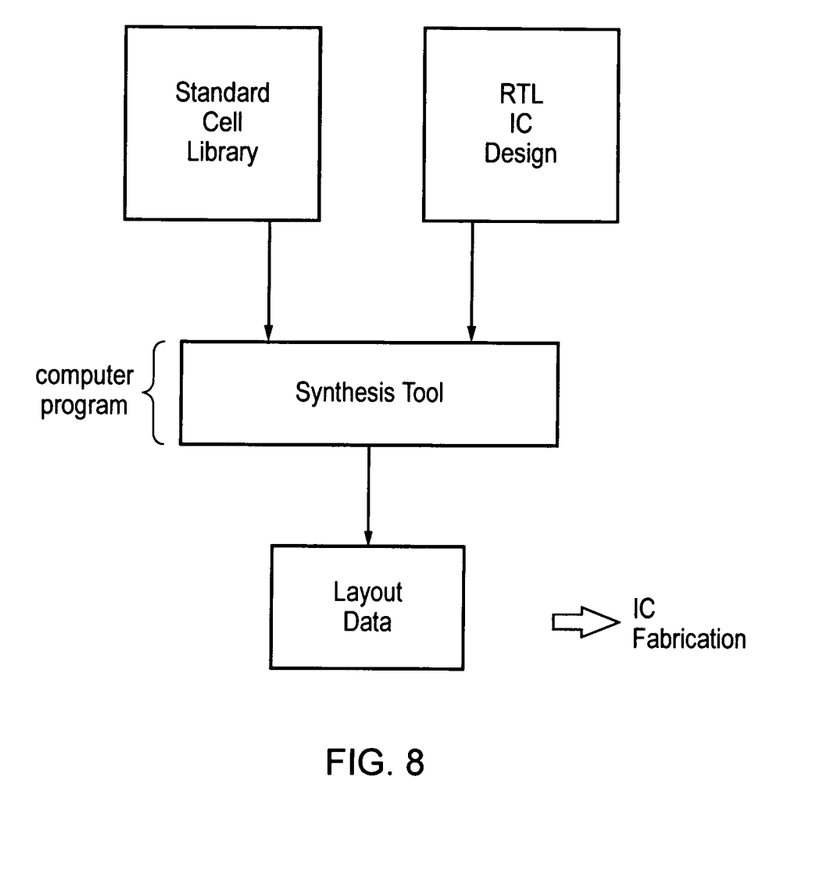
FIG. 8 is a diagram schematically illustrating integrated circuit fabrication starting from standard cell libraries and a register transfer language design utilising a synthesis tool.

FIG. 8 schematically illustrates the process of forming an integrated circuit from a standard cell library and a register transfer language integrated circuit design. The standard cell library contains data defining the form and nature of standard cells 4 as illustrated in FIG. 1 and from which an integrated circuit 2 is to be built. The standard cells provide building blocks from which the design specified in the register transfer language integrated circuit design may be instantiated. The standard cell library and the RTL integrated circuit design are provided as inputs to a synthesis tool which operates as a computer program to generate layout data. The layout data may, for example, be data defining masks to be used in integrated circuit fabrication. The layout data is used within a manufacturing environment to produce the integrated circuit 2 incorporating the standard cells as specified in the standard cell library. The standard cells may include standard cells required to provide the header and footer connections as discussed above and in particular those with the combinatorial logic circuitry 14 connected to the virtual power rails and the signal value storing circuitry 16 connected to one of the main power rail and the ground power rail with its other power connection being to a virtual power rail.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
   a main power rail;
   a virtual main power rail connected to said main power rail by one or more first operational mode transistors and one or more first retention mode transistors;
   a ground power rail;
   a virtual ground power rail connected to said ground power rail by one or more second operational mode transistors and one or more second retention mode transistors;
   combinatorial logic circuitry connected between said virtual main power rail and said virtual ground power rail;
   signal value storage circuitry connected between one of:
   (a) said main power rail and said virtual ground power rail; and
   (b) said virtual main power rail and said ground power rail; and
   power control circuitry coupled to and configured to control said one or more first operational mode transistors, said one or more first retention mode transistors, said one or more second operational mode transistors and said one or more second retention mode transistors such that:
   (i) in an operational mode said one or more first operational mode transistors and said one or more second operational mode transistors are in a low impedance state to provide an operating voltage difference sufficient to support data processing operations and signal value retention across said combinatorial logic circuitry and said signal value storage circuitry;
   (ii) in a retention mode said one or more first operational mode transistors and said one or more second operational mode transistors are in a high impedance state and said one or more first retention mode transistors and said one or more second retention mode transistors are in a low impedance state to provide a low power voltage difference insufficient to support data processing operations across said combinatorial logic circuitry and a retention voltage difference greater than said low power voltage difference and sufficient to support signal value retention across said signal value storage circuitry; and (iii) in a power off mode said one or more first operational mode transistors, said one or more second operational mode transistors, said one or more first retention mode transistors and said one or more second retention mode transistors are in a high impedance state to provide a power off voltage difference insufficient to support data processing operations and signal value retention across said combinatorial logic circuitry and said signal value storage circuitry.

2. An integrated circuit as claimed in claim 1, wherein said one or more first operational mode transistors are P-type field effect transistors and said one or more first retention mode transistors are N-type field effect transistors with a threshold voltage of Vtn Volts such that said virtual main power rail is held at a potential of Vtn Volts below that of said main power rail during said retention mode.

3. An integrated circuit as claimed in claim 1, wherein said one or more second operational mode transistors are N-type field effect transistors and said one or more second retention mode transistors are P-type field effect transistors with a threshold voltage of Vtp Volts such that said virtual ground power rail is held at a potential of Vtp Volts above that of said ground power rail during said retention mode.

4. An integrated circuit as claimed in claim 3, wherein said one or more first operational mode transistors are P-type field effect transistors and said one or more first retention mode transistors are N-type field effect transistors with a threshold voltage of Vtn Volts such that said virtual main power rail is held at a potential of Vtn Volts below that of said main power rail during said retention mode.

5. An integrated circuit as claimed in claim 4, wherein a voltage difference between said main power rail and said ground power rail is Vop Volts and Vop/3 is greater than or equal to (Vop−(Vtn+Vtp)).

6. An integrated circuit as claimed in claim 1, wherein signal value storage circuitry is connected between said main power rail and said virtual ground power rail and said power control circuitry operates in a reset mode to control said one or more second retention mode transistors to have a high impedance state such that said signal value storage circuitry is in a low power state that does not ensure signal value retention.

7. An integrated circuit as claimed in claim 1, wherein signal value storage circuitry is connected between said virtual main power rail and said ground power rail and said power control circuitry operates in a reset mode to control said one or more first retention mode transistors to have a high impedance state such that a voltage difference across said signal value storage circuitry is in a low power state that does not ensure signal value retention.

8. An integrated circuit as claimed in claim 1, wherein said one or more first operational mode transistors have a greater drive strength than said one or more first retention mode transistors and said one or more second operational mode transistors have a greater drive strength than said one or more second retention mode transistors.

9. An integrated circuit as claimed in claim 1, comprising an isolation gate located in a signal path between said combinatorial logic circuitry and said signal value storage circuitry, power control circuitry being configured to control said gate to output a predetermined signal value when in said retention mode.

10. An integrated circuit as claimed in claim 1, wherein said power control circuitry controls at least some of said one or more first operational mode transistors, said one or more first retention mode transistors, said one or more second operational mode transistors and said one or more second retention mode transistors by pulse width modulating gate voltages applied thereto.

11. An integrated circuit as claimed in claim 10, wherein pulse width modulation of gate voltages of said one or more first retention mode transistors and said one or more second retention mode transistors is used to provide an increased voltage drop across said one or more first retention mode transistors and said one or more second retention mode transistors when a voltage difference between said main power rail and said ground power rail is increased.

12. An integrated circuit as claimed in claim 10, wherein pulse width modulation of gate voltages of at least one of: (i) said one or more first operational mode transistors; and (ii) said one or more second operational mode transistors is used to provide a reduced voltage difference between said main power rail and said ground power rail.

13. An integrated circuit as claimed in claim 1, wherein said combinatorial logic circuitry and said signal value storage circuitry are controlled by a clock signal and said power control circuitry switches from said retention mode to said power off mode after a predetermined number of cycles of said clock signal have elapsed without any trigger to return to said operational mode.

14. A computer readable storage medium storing in non-transitory form standard cell library data for controlling a computer to form layout data for controlling manufacture of an integrated circuit as claimed in claim 1.

15. An integrated circuit comprising:
main power rail means for providing a main power voltage;
virtual main power rail means for providing a virtual main power voltage and connected to said main power rail means by one or more first operational mode transistor means for selectively conducting and one or more first retention mode transistor means for selectively conducting;
ground power rail means for providing a ground power voltage;
virtual ground power rail means for providing a virtual ground power voltage and connected to said ground power rail means by one or more second operational mode transistor means for selectively conducting and one or more second retention mode transistor means for selectively conducting;
combinatorial logic means for performing processing operations and connected between said virtual main power rail means and said virtual ground power rail means;
signal value storage means for storing a signal value and connected between one of:
  (a) said main power rail means and said virtual ground power rail means; and
  (b) said virtual main power rail means and said ground power rail means; and
power control means for controlling power and coupled to and configured to control said one or more first operational mode transistor means, said one or more first retention mode transistor means, said one or more second operational mode transistor means and said one or more second retention mode transistor means such that:

(i) in an operational mode said one or more first operational mode transistor means and said one or more second operational mode transistor means are in a low impedance state to provide an operating voltage difference sufficient to support data processing operations and signal value retention across said combinatorial logic means and said signal value storage means;

(ii) in a retention mode said one or more first operational mode transistor means and said one or more second operational mode transistor means are in a high impedance state and said one or more first retention mode transistor means and said one or more second retention mode transistor means are in a low impedance state to provide a low power voltage difference insufficient to support data processing operations across said combinatorial logic means and a retention voltage difference greater than said low power voltage difference and sufficient to support signal value retention across said signal value storage means; and (iii) in a power off mode said one or more first operational mode transistor means, said one or more second operational mode transistor means, said one or more first retention mode transistor means and said one or more second retention mode transistor means are in a high impedance state to provide a power off voltage difference insufficient to support data processing operations and signal value retention across said combinatorial logic means and said signal value storage means.

16. A method of operating an integrated circuit having:

a main power rail;

a virtual main power rail connected to said main power rail by one or more first operational mode transistors and one or more first retention mode transistors;

a ground power rail;

a virtual ground power rail connected to said ground power rail by one or more second operational mode transistors and one or more second retention mode transistors;

combinatorial logic circuitry connected between said virtual main power rail and said virtual ground power rail;

signal value storage circuitry connected between one of:
(a) said main power rail and said virtual ground power rail; and
(b) said virtual main power rail and said ground power rail; and said method comprising the steps of:
(i) in an operational mode, controlling said one or more first operational mode transistors and said one or more second operational mode transistors to have a low impedance state to provide an operating voltage difference sufficient to support data processing operations and signal value retention across said combinatorial logic circuitry and said signal value storage circuitry;

(ii) in a retention mode, controlling said one or more first operational mode transistors and said one or more second operational mode transistors are in a high impedance state and said one or more first retention mode transistors and said one or more second retention mode transistors to have a low impedance state to provide a low power voltage difference insufficient to support data processing operations across said combinatorial logic circuitry and a retention voltage difference greater than said low power voltage difference and sufficient to support signal value retention across said signal value storage circuitry; and (iii) in a power off mode, controlling said one or more first operational mode transistors, said one or more second operational mode transistors, said one or more first retention mode transistors and said one or more second retention mode transistors to have a high impedance state to provide a power off voltage difference insufficient to support data processing operations and signal value retention across said combinatorial logic circuitry and said signal value storage circuitry.

* * * * *